United States Patent
Augendre et al.

(10) Patent No.: US 10,978,594 B2
(45) Date of Patent: Apr. 13, 2021

(54) TRANSISTOR COMPRISING A CHANNEL PLACED UNDER SHEAR STRAIN AND FABRICATION PROCESS

(71) Applicant: COMMISSARIAT A L'ENERGIE ATOMIQUE ET AUX ENERGIES ALTERNATIVES, Paris (FR)

(72) Inventors: Emmanuel Augendre, Montbonnot (FR); Maxime Argoud, La Chapelle de la Tour (FR); Sylvain Maitrejean, Grenoble (FR); Pierre Morin, Albany, NY (US); Raluca Tiron, Saint-Martin-le-Vinoux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/978,778

(22) Filed: Dec. 22, 2015

(65) Prior Publication Data
US 2016/0181439 A1  Jun. 23, 2016

(30) Foreign Application Priority Data
Dec. 23, 2014  (FR) .................................. FR1463176

(51) Int. Cl.
*H01L 29/786*   (2006.01)
*H01L 29/78*    (2006.01)
(Continued)

(52) U.S. Cl.
CPC ...... *H01L 29/78696* (2013.01); *H01L 27/127* (2013.01); *H01L 27/1222* (2013.01);
(Continued)

(58) Field of Classification Search
CPC ............. H01L 29/7842; H01L 29/7843; H01L 29/78696
See application file for complete search history.

(56) References Cited

U.S. PATENT DOCUMENTS 6,198,141 B1     3/2001   Yamazaki et al.
7,462,916 B2 *  12/2008   Williams ........ H01L 21/823807
                                                          257/395
(Continued)

FOREIGN PATENT DOCUMENTS

| EP | 2 346 078 A1 | 7/2011 | |
| JP | S60-175458 A | 9/1985 | |
| KR | 20070003228 A | * 1/2007 | ....... H01L 29/66757 |

OTHER PUBLICATIONS

J. Bai et al., "Graphene nanomesh," Nature Nanotechnology, vol. 5, pp. 190-194, Mar. 2010. (Year: 2010).*

(Continued)

*Primary Examiner* — Cuong Q Nguyen
*Assistant Examiner* — Peter M Albrecht
(74) *Attorney, Agent, or Firm* — BakerHostetler

(57) ABSTRACT

The invention relates to a field-effect transistor including an active zone including a source, a channel, a drain and a control gate, which is positioned level with said channel, allowing a current to flow through said channel between the source and drain along an x-axis, said channel including: a first edge of separation with said source; and a second edge of separation with said drain; said channel being compressively or tensilely strained, characterized in that said channel includes a localized perforation or a set of localized perforations along at least said first and/or second edge of said channel so as to also create at least one shear strain in said channel. The invention also relates to a process for fabricating said transistor.

13 Claims, 17 Drawing Sheets

(51) Int. Cl.
*H01L 29/10* (2006.01)
*H01L 29/423* (2006.01)
*H01L 29/49* (2006.01)
*H01L 29/66* (2006.01)
*H01L 27/12* (2006.01)

(52) U.S. Cl.
CPC ...... *H01L 29/1033* (2013.01); *H01L 29/1037* (2013.01); *H01L 29/42384* (2013.01); *H01L 29/4908* (2013.01); *H01L 29/66545* (2013.01); *H01L 29/66742* (2013.01); *H01L 29/66772* (2013.01); *H01L 29/78* (2013.01); *H01L 29/7842* (2013.01); *H01L 29/78654* (2013.01)

(56) References Cited

U.S. PATENT DOCUMENTS

| | | | | |
|---|---|---|---|---|
| 9,236,474 | B2* | 1/2016 | Morin | H01L 29/7842 |
| 2008/0128764 | A1 | 6/2008 | Lee | |
| 2010/0102292 | A1* | 4/2010 | Hiura | B82Y 10/00 |
| | | | | 257/9 |
| 2010/0320510 | A1 | 12/2010 | Loh et al. | |
| 2011/0014457 | A1* | 1/2011 | Quitoriano | B82Y 30/00 |
| | | | | 428/336 |
| 2012/0132893 | A1* | 5/2012 | Heo | H01L 29/0657 |
| | | | | 257/29 |
| 2013/0137235 | A1* | 5/2013 | Yu | H01L 21/823807 |
| | | | | 438/294 |

OTHER PUBLICATIONS

Skotnicki et al., "Heavily Doped and Extremely Shallow Junctions on Insulator-by SONCTION (SilicON Cut-off juncTION) process," International Electron Devices Meeting 1999, Technical Digest, Aug. 1, 2000, pp. 513-516, XP000933240.

M. V. Fischetti et al., "Band structure, deformation potentials, and carrier mobility in strained Si, Ge, and SiGe Alloys," Journal of Applied Physics, vol. 80, No. 4, Aug. 15, 1996, pp. 2234-2252.

H. S. Yang et al., "Dual Stress Liner for High Performance Sub-45nm Gate Length SOI CMOS Manufacturing," Technical Digest of IEDM 2004, pp. 1075-1077.

R.Tiron et al., "Optimization of block copolymer self-assembly through graphoepitaxy: A defectivity study," J. Vac. Sci. Technology B 29(6), Nov./Dec. 2011.

R. Tiron et al., "Pattern density muliplication by direct self assembly of block copolymers using 193nm lithography," Sematech DSA Workshop 2010.

O. Weber et al., "Examination of Additive Mobility Enhancements for Uniaxial Stress Combined with Biaxially Strained Si, Biaxially Strained SiGe and Ge Channel MOSFETs," Technical Digest of the International Device Meeting, 2007, pp. 719-722.

\* cited by examiner

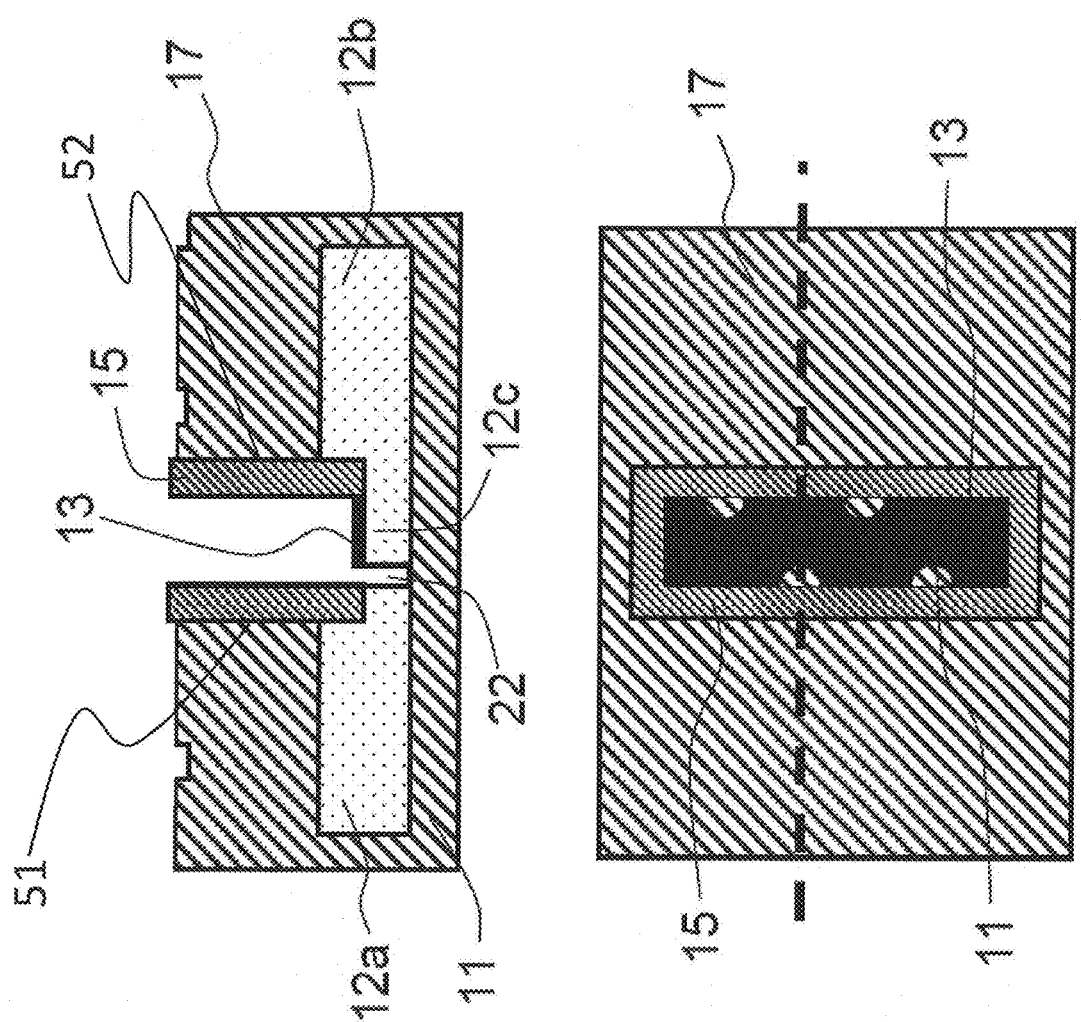

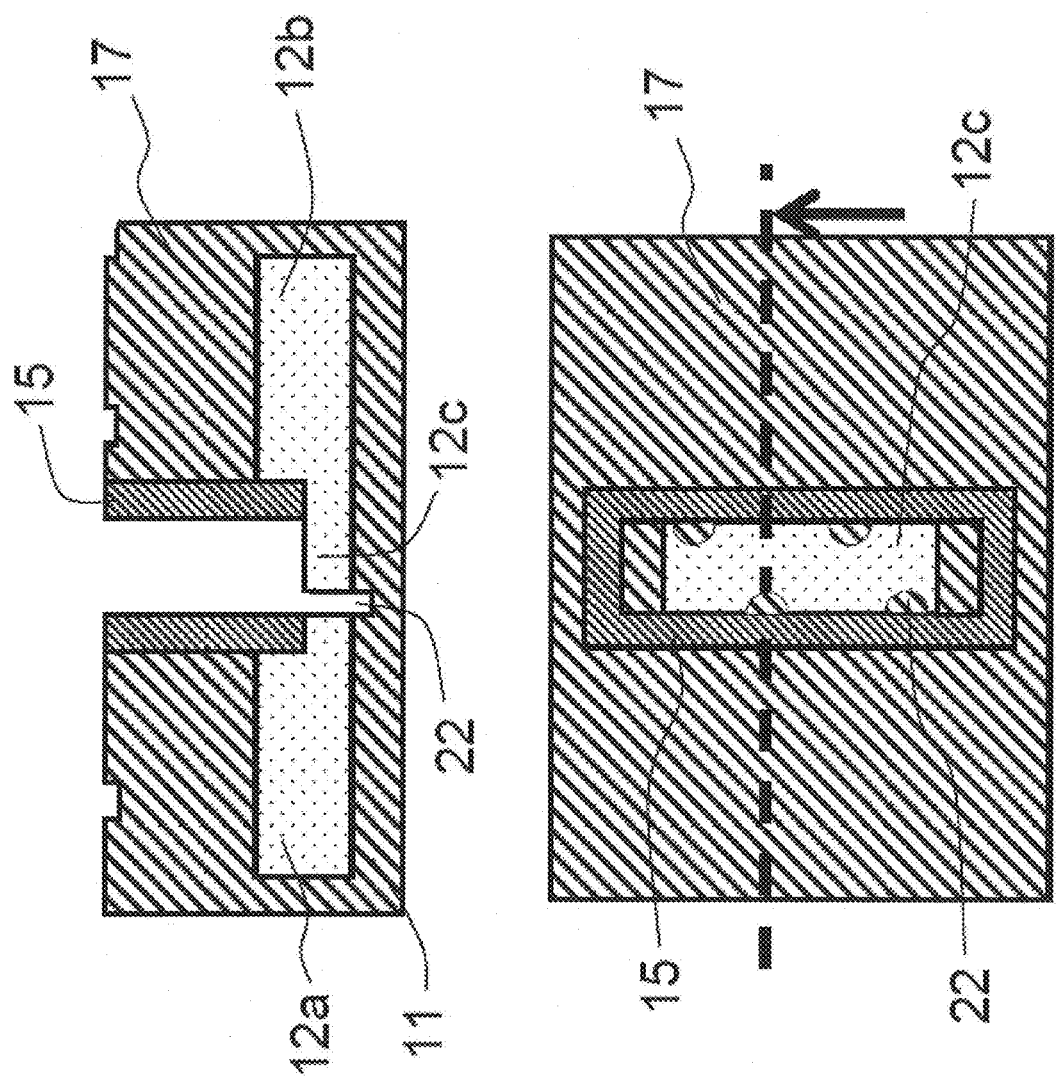

TRANSISTOR COMPRISING A CHANNEL PLACED UNDER SHEAR STRAIN AND FABRICATION PROCESS

CROSS-REFERENCE TO RELATED APPLICATIONS

This application claims priority to foreign French patent application No. FR 1463176, filed on Dec. 23, 2014, the disclosure of which is incorporated by reference in its entirety.

FIELD OF THE INVENTION

The field of the invention is that of semiconductors especially used in microelectronics and more precisely that of the insulated-gate field-effect transistors more commonly denoted MOSFETs (metal oxide semiconductor field effect transistors).

BACKGROUND

This type of transistor generally comprises a source and a drain separated by a channel through which charge carriers may flow, and a control gate, said gate being separated from the conductive channel by an insulating material also called the gate insulator.

In this field, it may be advantageous to introduce mechanical strain into the channel of devices:

to increase the mobility of charge carriers: at set bias, on-state current and the dynamic performance of the circuit is increased thereby; or to allow the same current to be obtained from a device at lower bias voltage, ensuring an unchanged circuit performance while decreasing dissipated power.

Compressive or tensile strain is especially known in the context of SiGe alloys to increase the respective mobilities of holes and electrons, as described in M. V. Fischetti and S. E. Laux, "Band structure, deformation potentials, and carrier mobility in strained Si, Ge, and SiGe Alloys", Journal of Applied Physics 80, 2234 (1996); doi: 10.1063/1.363052.

On the basis of piezoresistive coefficients, it is also possible to expect that a shear strain would increase the mobility of electrons and holes as explained in O. Weber et al., "Examination of Additive Mobility Enhancements for Uniaxial Stress Combined with Biaxially Strained Si, Biaxially Strained SiGe and Ge Channel MOSFETs", Technical Digest of the International Device Meeting, 2007, pp. 719-722. A structure introducing a shear strain into a p-type transistor has also been proposed and described in patent U.S. Pat. No. 7,274,084. More precisely, in this structure, the shear strain is introduced into the pMOSFET device by way of two grayed peripheral regions located in contact with the active zone of the transistor and filled with a compressive or tensile material. Nevertheless, as shown in FIG. 1 of this patent, reproduced in FIG. 1 of the present description, the source of deformation of the proposed structure is located far from the channel and is therefore of limited influence.

SUMMARY OF THE INVENTION

This is why, in this context, one subject of the present invention is a field-effect transistor in which a shear strain is introduced directly into the region of the channel in order to increase efficiency, this being done in a MOS device the channel of which is compressively or tensilely (biaxially) strained beforehand. The shear strain is generated because of the presence of at least one perforation along at least one source-side channel edge and/or one drain-side channel edge.

More precisely one subject of the present invention is a field-effect transistor including an active zone comprising a source, a channel, a drain and a control gate, which is positioned level with said channel, allowing a current to flow through said channel between the source and drain along an x-axis, said channel comprising:

a first edge of separation with said source; and a second edge of separation with said drain;

said channel being compressively or tensilely strained, characterized in that said channel includes a localized perforation or a set of localized perforations along at least said first and/or second edge of said channel so as to also create at least one shear strain in said channel.

According to one variant of the invention, the transistor comprises a semiconductor layer on the surface of a buried oxide layer (BOX), said semiconductor layer being compressively or tensilely prestrained at the surface of said buried oxide layer.

According to one variant of the invention, the channel being made of silicon, of germanium or of an SiGe alloy, the source and the drain comprise species able to be alloys of elements of column IV, contributing to place the channel under tension or compression uniaxially.

According to one variant the invention, the active zone is embedded in a dielectric zone comprising an upper portion, the gate being located in a gate cavity defined in said upper portion of said zone.

According to one variant of the invention, the semiconductor is an SiGe alloy on the surface of a silicon oxide layer.

According to one variant of the invention, the transistor comprises a set of perforations staggered along said first and second edges of the channel. This advantageous variant of the array of hexagonal perforations in the plane corresponds to a distribution that is particularly favorable to the shear and that achieves a better shear strain.

According to one variant of the invention, the transistor comprises a set of perforations distributed over a single source-side or drain-side channel edge.

According to one variant of the invention, the one or more perforations is (are) filled with at least one filling material, possibly a material having a high Young's modulus (typically higher than 200 GPa), possibly $HfO_2$.

According to one variant of the invention, one of the filling materials of said perforation(s) also covers the internal walls of the gate cavity.

According to one variant of the invention, the dimensions of the perforations are of the order of a few nanometers, the thickness of the channel being comprised between a few nanometers and about one hundred nanometers.

According to one variant of the invention, the active zone having a width W' along a y-axis perpendicular to the x-axis, said width respects the following equation: $W'=n L_0$ where n is an integer and $L_0$ is the distance between two adjacent perforations, the number of perforations along the first edge being identical to the number of perforations along the second edge along the y-axis.

Another subject of the invention is a device comprising a set of transistors according to the present invention on the surface of a substrate.

In this collective configuration and according to one variant of the invention, the distances between the gate cavities of the transistors meets the following criteria:

along the x-axis and along which the channel length L is defined, the distance λ between two adjacent gates is equal to m·$a_0$, where m is an integer and $a_0$=√3/2 $L_0$ (λ=m·$a_0$), $a_0$ being the distance between two rows of adjacent perforations;

along the y-axis and along which the width of the active zone W' is defined, the distance ω between two adjacent gates is equal to n·$L_0$/2 where n is an integer (ω=n·$L_0$/2).

Yet another subject of the invention is a process for fabricating a field-effect transistor including an active zone comprising a source, a channel, a drain, and a control gate, which is positioned level with said channel, allowing a flow of charge carriers in said channel to be controlled, characterized in that it comprises the following steps:

producing a MOSFET transistor structure including a source, a channel, a drain and a sacrificial gate above said channel, said channel being compressively or tensilely strained;

depositing a dielectric layer to encapsulate said structure with a dielectric that is possibly an oxide;

selectively etching said sacrificial gate so as to define a gate cavity through said encapsulating dielectric layer;

depositing a block copolymer comprising a first species and a second species in said gate cavity having a source-side first internal wall and a drain-side second internal wall;

removing the first or second species so as to define masking patterns positioned facing at least one of said walls and opening onto the bottom of the gate cavity;

producing one or more perforations in said channel facing said wall or said walls;

depositing at least one gate material in the gate cavity facing the perforated channel.

According to one variant of the invention, the process comprises a step of filling the perforation(s) with a least one filling material.

According to one variant of the invention, the process comprises depositing, then annealing and rinsing, a neutralizing layer, which allows it to be grafted, prior to the deposition of the block copolymer layer, so as to allow the perforations in said channel to be given a preferred orientation.

According to one variant of the invention, the block copolymer is PS-b-PMMA, the material of the neutralizing layer being PS-r-PMMA.

According to one variant of the invention, said process comprises depositing a layer of filling material on the internal walls of the gate cavity by a filling material, having a high Young's modulus (typically higher than 200 GPa), possibly $HfO_2$.

According to one variant of the invention, the process comprises localized treatment of said neutralizing layer so as to make said neutralizing layer active only level with one of the two said drain or source edges.

According to one variant of the invention, said treatment is carried out with a hydrogen ion implantation beam making a tilt angle:

θ=arctan(L/H), where L is the length of the channel along the x-axis and H is the depth of said gate cavity.

This process is particularly suitable for defining perforations on a single of the source or drain edges.

BRIEF DESCRIPTION OF THE DRAWINGS

The invention will be better understood and other advantages will become apparent on reading the following non-limiting description and by virtue of the appended figures, in which:

FIGS. 6a to 6l illustrate the steps of an exemplary process for fabricating a transistor according to the invention;

DETAILED DESCRIPTION

Figure 1:
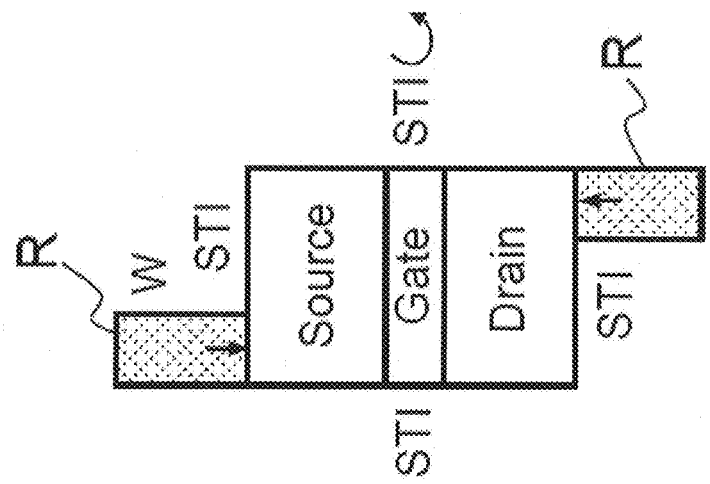
FIG. 1 illustrates a prior-art structure comprising zones allowing shear strains to be introduced.
Figure 1:
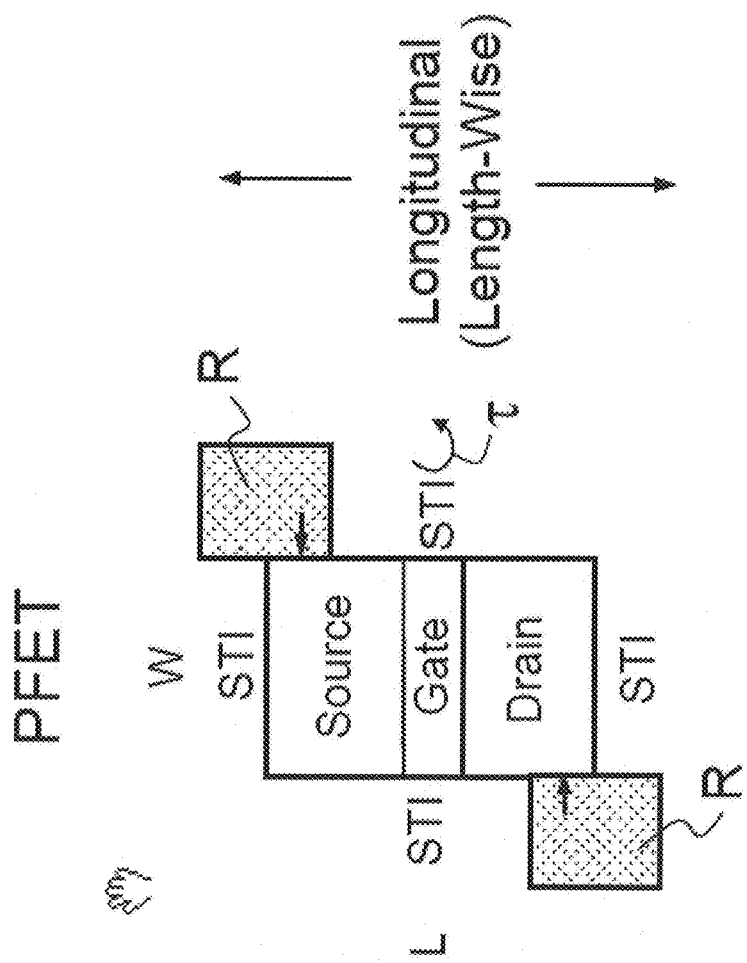
Figure 2:
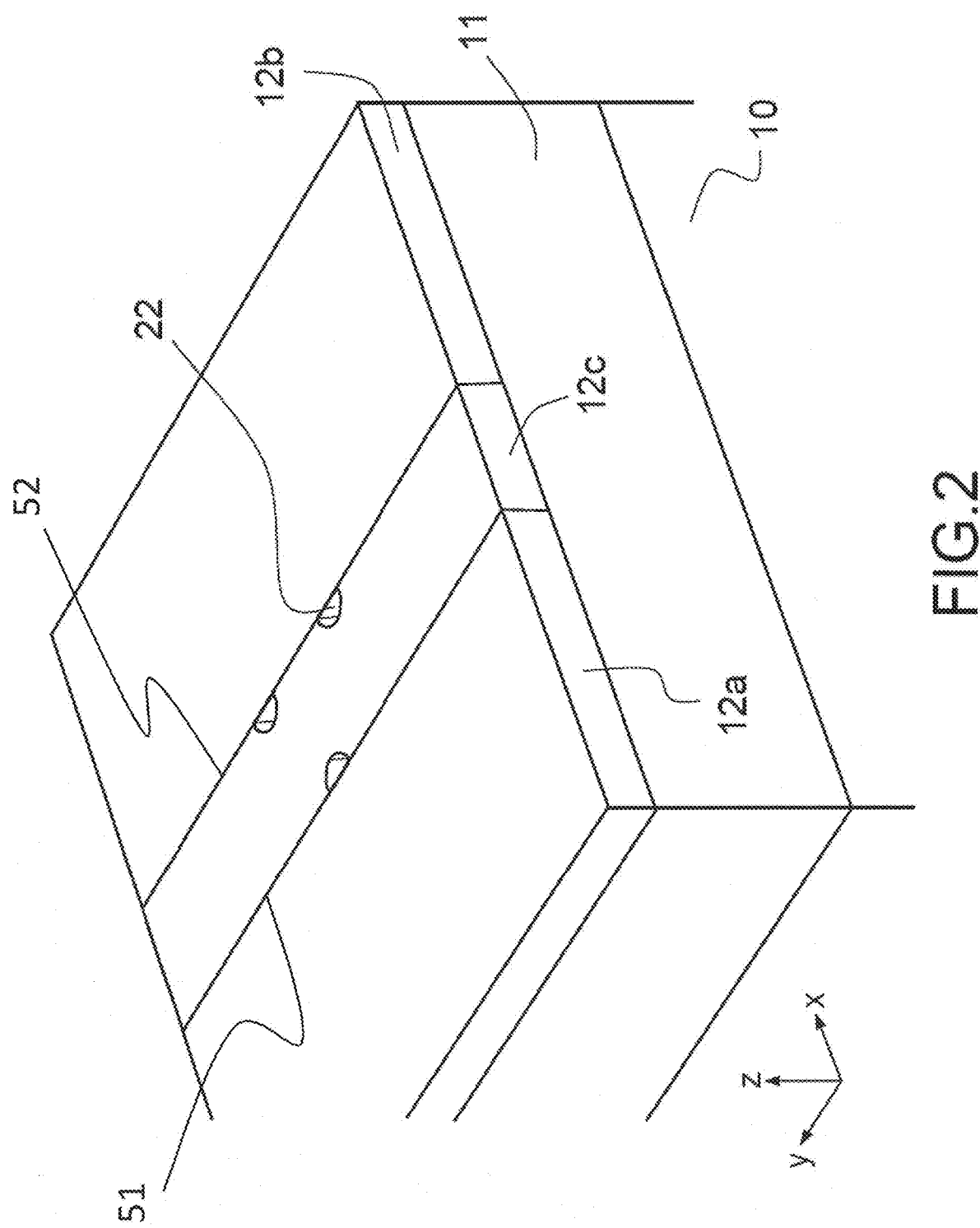
FIG. 2 schematically shows a transistor structure according to the invention comprising a channel including staggered perforations.

Generally, the MOSFET transistor according to the present invention comprises, as schematically shown in FIG. 2, on the surface of a substrate 10 and of a buried oxide layer 11, a semiconductor film in which are produced in a conventional way a source 12a and a drain 12b separated by a channel 12c (the gate has not been shown in order to allow the perforations to be seen). Only three perforations are shown, but in principle, and generally, it is advantageous to produce perforations over the entire width of the channel (dimension along the y-axis) on at least one of the two edges, 51, 52. According to the present invention, the channel 12c may thus advantageously comprise staggered perforations level with the two edges, 51, 52, allowing at least one shear strain to be generated.

The Applicant has carried out simulations allowing the existence of shear strain to be demonstrated.

To do this, the dimensions of the compressed 25% SiGe channel pMOS transistor structure simulated were the following for an SiGe-on-insulator (SGOI) structure. The channel 12c and the source/drain 12a and 12b of the transistor were formed on a 25% SiGe film resting on a buried oxide 11:

$W_{\_SOI}$: total width (along y) of the SGOI film, $W_{SOI}$=100 nm $L_{\_SOI}$: total length (along x) of the SGOI film, $L_{\_SOI}$=100 nm For the simulation, the SGOI film rested on a buried oxide (BOX) itself resting on the substrate, Sub (10), the respective width and length of which were W_Sub=140 nm and $L_{\_Sub}$=140 nm.

Sa and Sb are the respective lengths (in the x-direction) of the source (12a) and drain (12b). Sa=Sb=41 nm.

Such a structure may be produced in the following way if a pre-strained channel is to be obtained: an SiGe layer is compressively strained by an enriching process. Starting with a relaxed Si film (SOI film), the enrichment starts with epitaxial growth of SiGe followed by oxidation of this layer during which the oxide formed is an $SiO_2$; the germanium of the SiGe is repulsed into the Si film, which gradually becomes enriched, in order to form an SiGe film that is compressively strained (in the plane, because of the lattice parameter of the initial relaxed Si film).

The simulated structure comprised a BOX oxide layer of a thickness H_BOX of 25 nm and the channel thickness H_SOI was 6 nm.

Figure 3:
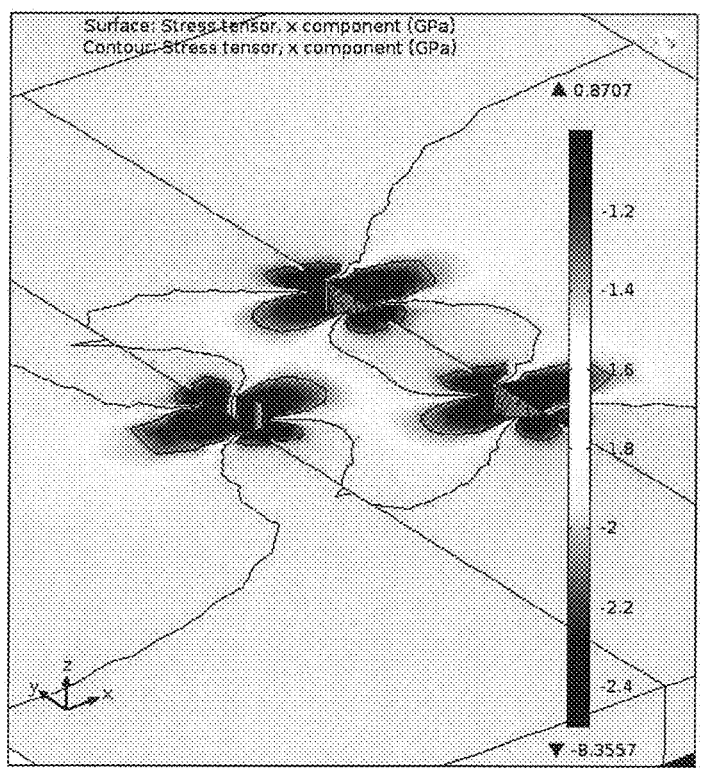
FIG. 3 illustrates the x-component of the stress tensor obtained in a simulated structure such as that illustrated in FIG. 2.
Figure 4:
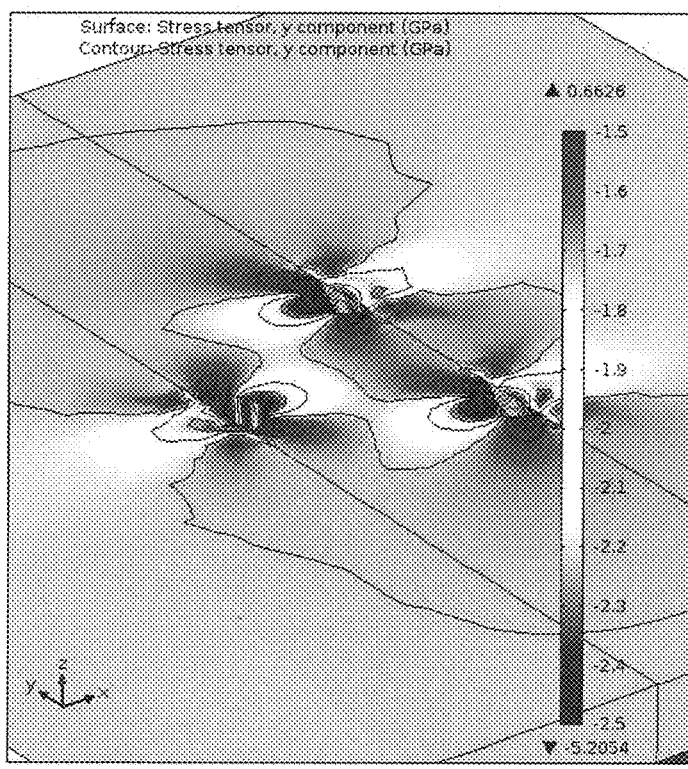
FIG. 4 illustrates the y-component of the stress tensor obtained in a simulated structure such as that illustrated in FIG. 2.
Figure 5:
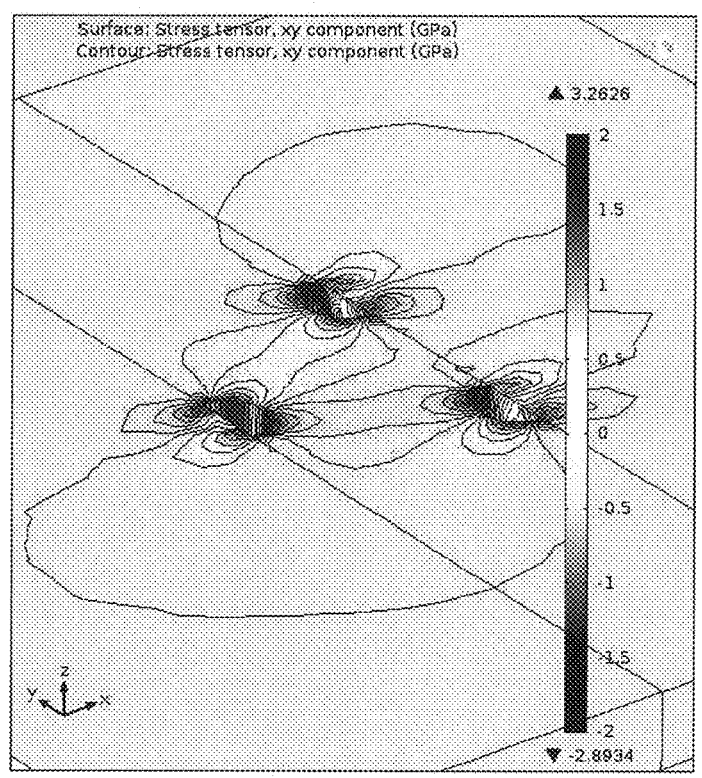
FIG. 5 illustrates the shear component of the stress tensor obtained in a simulated structure such as that illustrated in FIG. 2.

The dimensions of the simulated structure were the following: essentially a width (along the y-axis) of 100 nm, a total length (along the x-axis) of 100 nm, a channel length (along the x-axis) of 18 nm, with a layer of SiGe of 6 nm thickness. FIG. 3 illustrates the results of the component along the x-axis of the stress tensor. FIG. 4 illustrates the results of the component along the y-axis of the stress tensor. FIG. 5 illustrates the results of the shear component of the stress tensor.

From these three figures it may be seen that the perforations offer the following advantages with respect to carrier transport:

they create two oblique zones of shear strain. The staggered distribution of the perforations allows the oblique zones created on either side of the gate to superpose and occupy the length of the channel (FIG. 5); and they relax transversely the initial biaxial strain (along the y-axis) and conjointly increase its longitudinal component (along the x-axis) at the source/drain-channel transition, in the immediate vicinity of the perforations (FIGS. 3 and 4).

To obtain such a transistor, generally, the fabrication process according to the present invention mainly consists in:

producing a device on a biaxially strained thin film in a gate last configuration (the final gate materials are introduced after production of the sources and drain around a channel and of a sacrificial gate);

introducing at least one perforation and advantageously a set of staggered perforations into the channel of the transistor using a cylindrical block copolymer, after the removal of the sacrificial gate; and producing the gate of the transistor (the final gate materials are introduced after the sources and drain have been produced around the sacrificial gate).

According to the present invention, the pre-strained channel thus allows perforations of small size to generate shear strains of significant amplitude.

Advantageously, it is possible to prestrain the channel using the following (independent and additive) means for straining the channel:

generating, by construction, a blanket strain everywhere in the channel material. This is the case for sSOI (tensilely strained thin Si layer) or when use is made of an SiGe alloy that is compressively strained because obtained by an enriching process on Si;

using the source and drain to generate a local strain. Epitaxial growth of strain materials in the source and drain zones (in general alloys of elements of column IV, for example SiGe to place the channel under compression and SiC to place the channel under tension). This approach is advantageous in the case of the present invention because the amplitude of the strain generated by the source/drain is exacerbated by the use of a sacrificial gate allowing the perforations to be produced before the production of the final gate (gate replacement step);

generating local strain by depositing strain layers (of the 'contact etch stop layer' type) as mentioned in the publication H. S. Yang, et al.; *"Dual Stress Liner for High Performance Sub-45 nm Gate Length SOI CMOS Manufacturing"*, Technical Digest of IEDM 2004, pp. 1075-107.

The Applicant describes below an exemplary process for fabricating a transistor according to the invention comprising perforations in its channel level with the first edge 51 of separation with the source and the second edge 52 of separation with the drain.

Figure 6A:
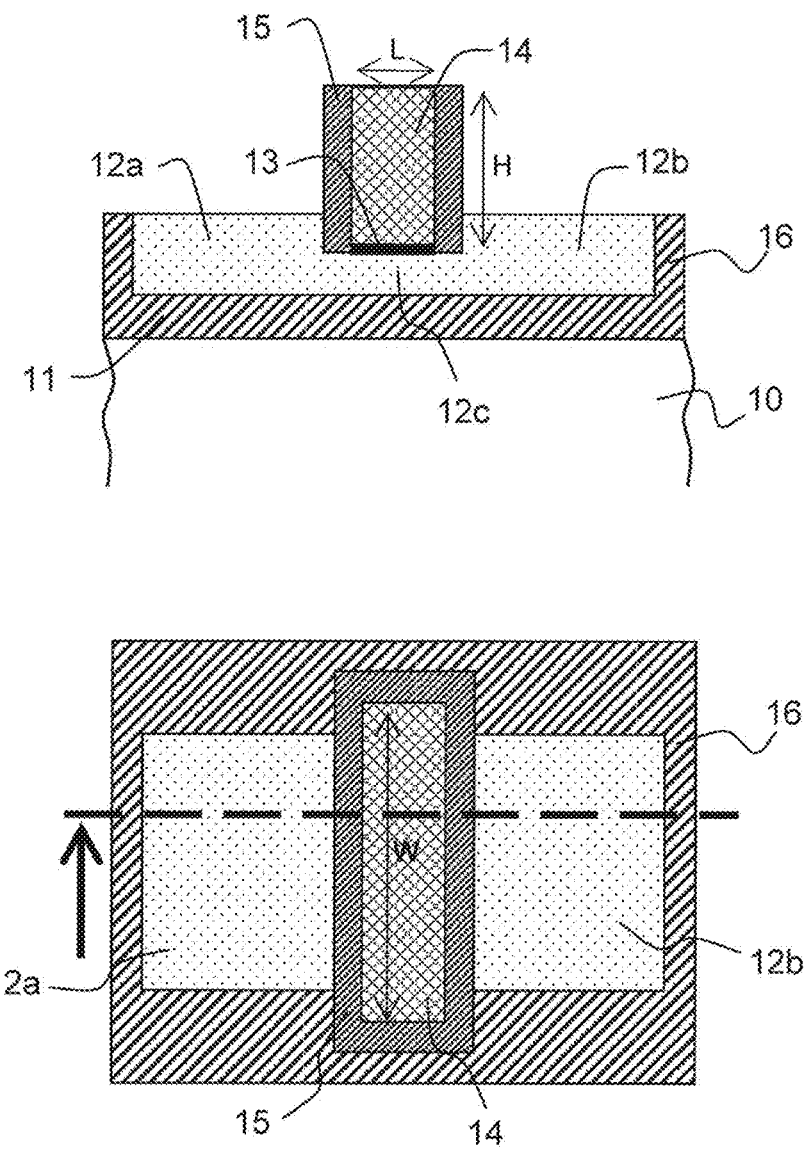

First Exemplary Process for Fabricating a MOSFET Transistor According to the Invention:

A first series of steps relates to the production of a transistor with a sacrificial gate:

Step 1:

Firstly a transistor is produced on a thin biaxially (tensilely or compressively) strained semiconductor film, comprising a source S, a gate G and a drain D, on the surface of a buried oxide layer, on the surface of a substrate, the oxide layer is commonly denoted a BOX, acronym for buried oxide. The transistor has a channel length L, a gate height H, a gate cavity width W and a channel thickness t. FIG. 6a illustrates this structure comprising on the surface of a substrate 10, a buried oxide layer 11, on the surface of which are produced the source 12a, and the drain 12b on either side of the channel 12c, in a thin strained semiconductor film. Spacers 15 on the flanks of what is called the sacrificial gate 14, typically made of silicon nitride, are provided, these spacers being intended to insulate, in the end, the gate from the drain and from the source. The active zone comprising the source, the gate and the drain may be bounded by dielectric elements 16 possibly advantageously oxide elements. The gate of this transistor is sacrificial and typically produced from polysilicon, on a gate oxide 13 which may be made of very thin silicon oxide, typically of about 2 to 5 nm in thickness.

(In the other steps of the process described below, the substrate 10 is present but not shown).

Figure 6B:
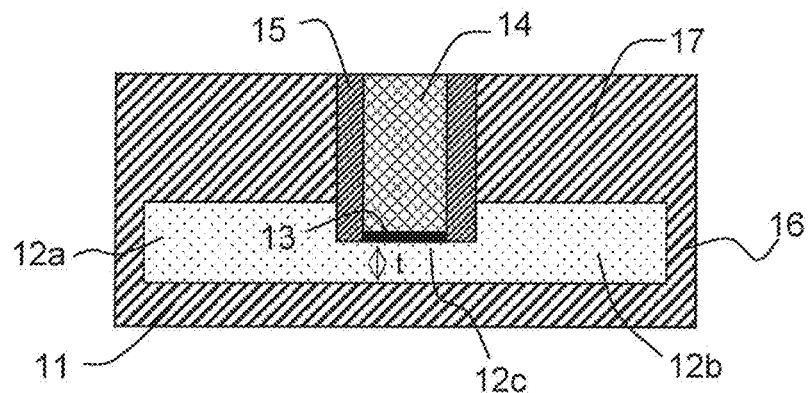
Figure 6B:
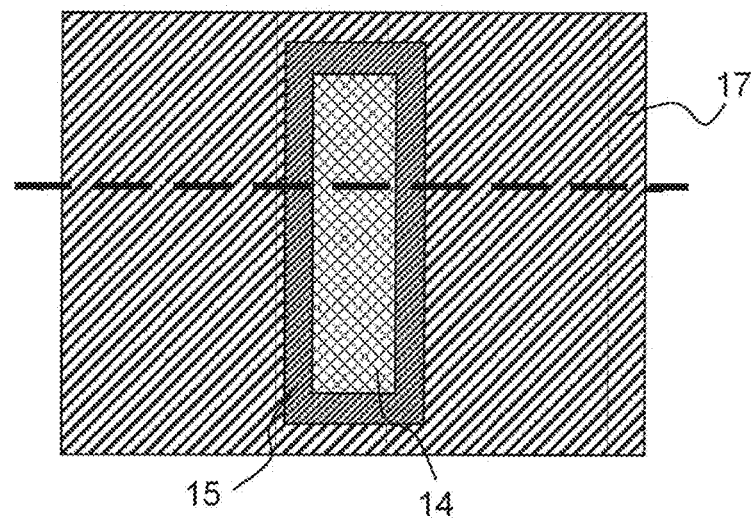

Step 2:

An oxide layer is deposited and an operation of planarizing this oxide layer by chemical mechanical polishing (CMP) is carried out until the top of the gate is exposed. FIG. 6b illustrates this deposited oxide layer 17 after planarization.

Figure 6C:
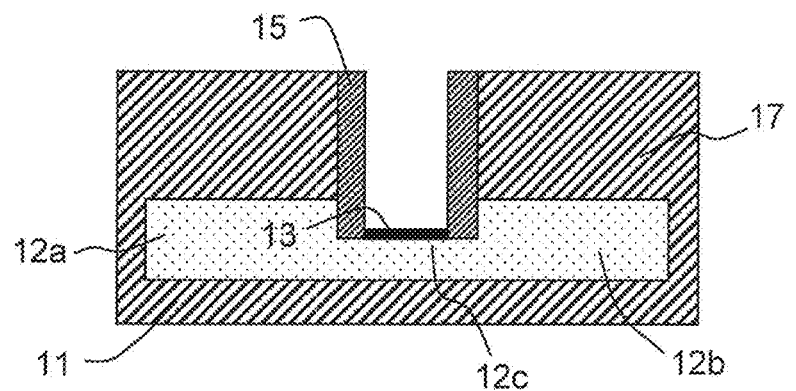
Figure 6C:
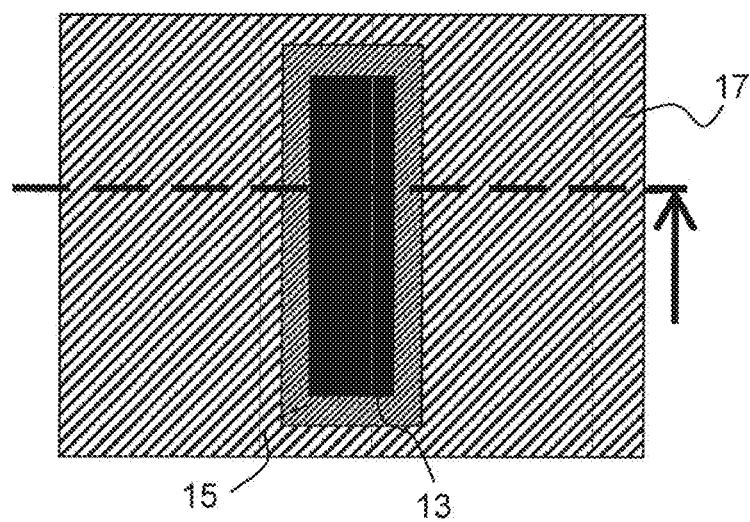

Step 3:

In this third step the sacrificial gate 14 is etched selectively over the gate oxide 13 and spacers 15, as illustrated in FIG. 6c, allowing a gate cavity to be cleared.

A second series of steps relates to the production of perforation patterns in the hard oxide mask, on the cavity bottom:

Step 4

What is called a neutralizing layer, allowing the gate cavity bottom surface to be prepared, is deposited. More precisely, a layer of block copolymer is spread and cross-linked.

In the case of a cylindrical copolymer such as PS-b-PMMA for example, intended to produce the perforations, it is possible to control the surface state so as to obtain half-cylinders of PMMA (polymethyl methacrylate) that form a hexagonal array in a PS (polystyrene) matrix and that tend to align vertically and that straddle the gate cavity edges for example by using a so-called "random" copolymer PS-r-PMMA that allows the vertical orientation of the PMMA cylinders: by virtue of the neutralizing layer, the two blocks of the block copolymer are of equivalent affinity to the edges and bottom of the cavity.

The experimental conditions of such a preparation are described in the article R. Tiron et al. SPIE 2012, "Pattern density multiplication by direct self assembly of block copolymers: Towards 300 nm CMOS requirements" Vol. 8323.

Figure 6D:
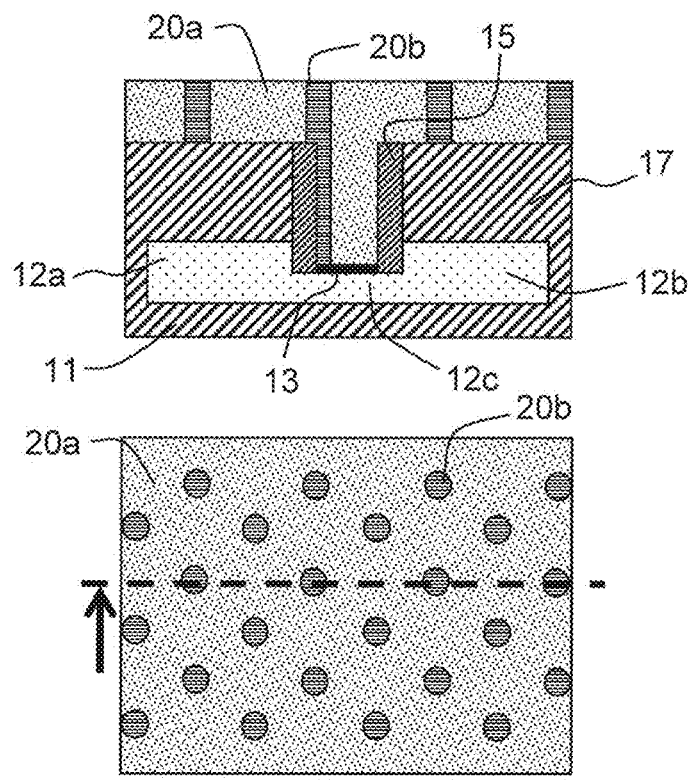

FIG. 6d thus illustrates the deposition of a block copolymer layer intended for the production of the perforations, in the gate cavity (the neutralizing layer is not shown), defining patterns 20b of PMMA in polystyrene 20a.

Figure 6E:
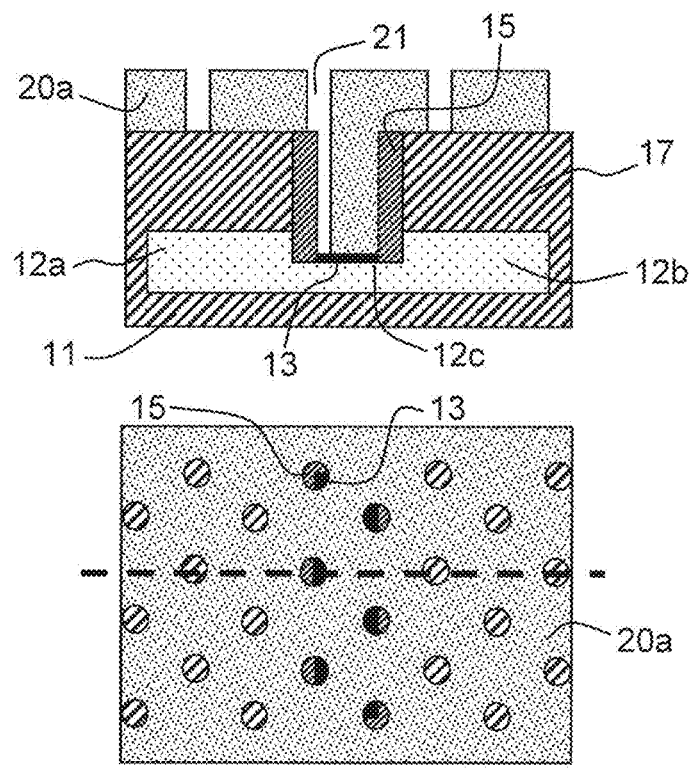

Step 5:

The PMMA phase 20b is then removed (for example by wet processing with a acetic acid solution after exposure to UV), creating vertical through-cavities. FIG. 6e illustrates the apertures 21 thus created in the block copolymer layer. An additional reactive ion etching (RIE) step (Ar/O₂ plasma) allows PS-r-PMMA surface treatment layer residues present at the bottom of the cavity to be removed.

The top view shows that the perforations expose a portion of the spacers 15 and of the gate oxide 13 at the bottom of the gate cavity.

Figure 6F:
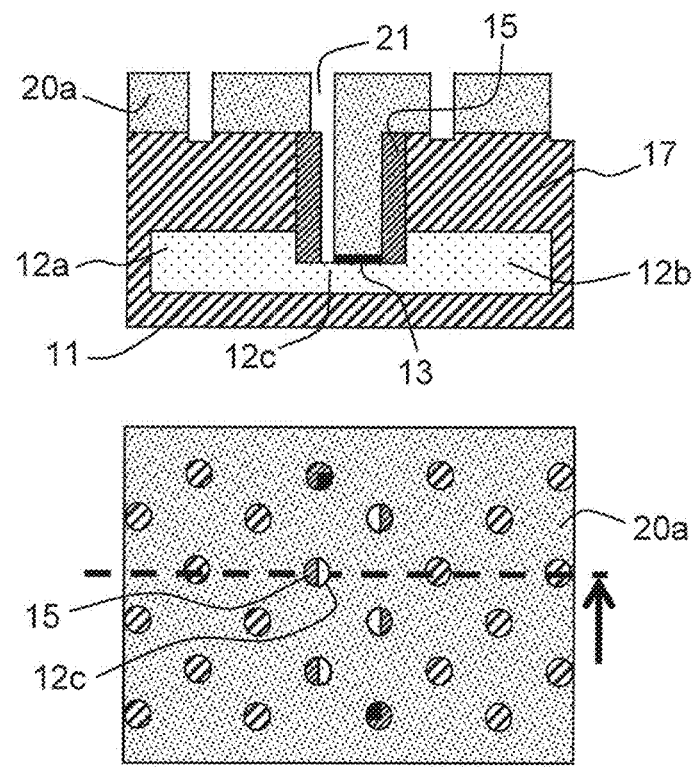

Step 6:

The sacrificial gate oxide is etched through the apertures in the PS mask. FIG. 6f illustrates the apertures 21 thus extended into the gate oxide 13. Secondarily, the etching of the cavity bottom oxide is accompanied by similar etching of the oxide at the bottom of the holes outside the gate cavity, which may be avoided by producing an upper surface made of nitride, for example.

Figure 6G:
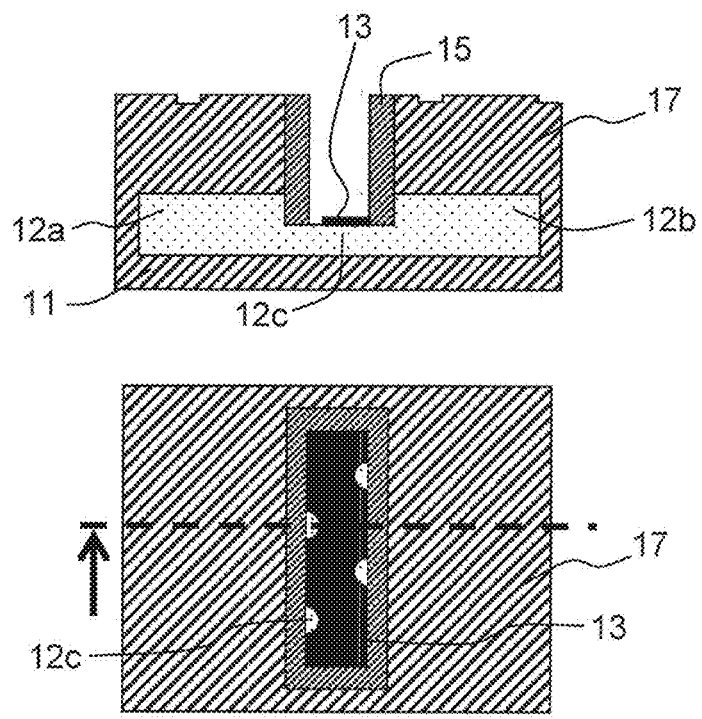

A third series of steps relates to the production of perforations in the channel:

Step 7:

In this step the hard mask consisting of the elements 20a is removed, as illustrated in FIG. 6g, which shows cleared channel elements 12c and the remaining gate oxide 13.

Step 8:

The channel is etched using the sacrificial gate oxide 13 as a hard mask, as illustrated in FIG. 6h.

The etch opens onto the BOX oxide layer 11, as illustrated in FIG. 6h, which shows the perforations 22 produced in the channel portion 12c of the semiconductor layer 11.

The two steps illustrated in FIGS. 6g and 6h may be combined into a single step of RIE etching in HBr/Cl₂/O₂, as described in the publication R. Tiron et al., Sematech DSA Workshop 2010.

Figure 6J:
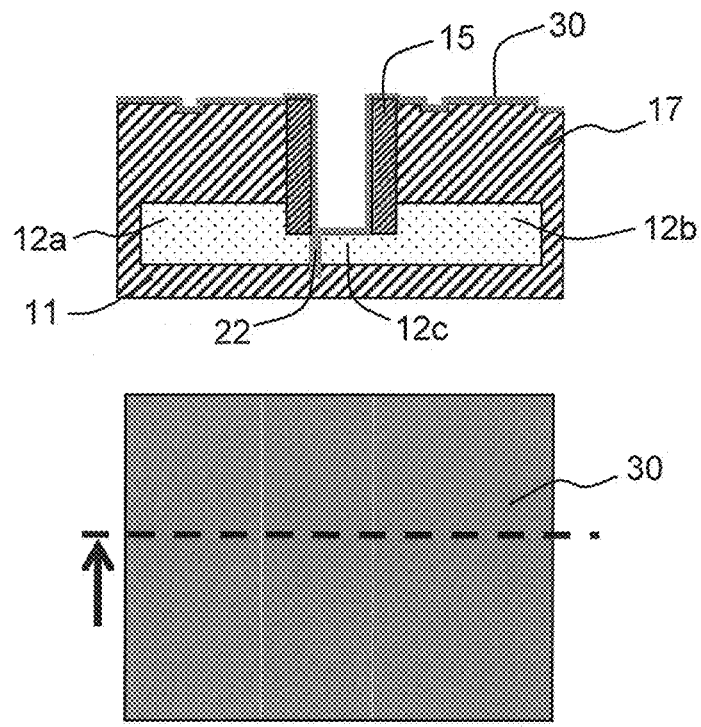
Figure 6K:
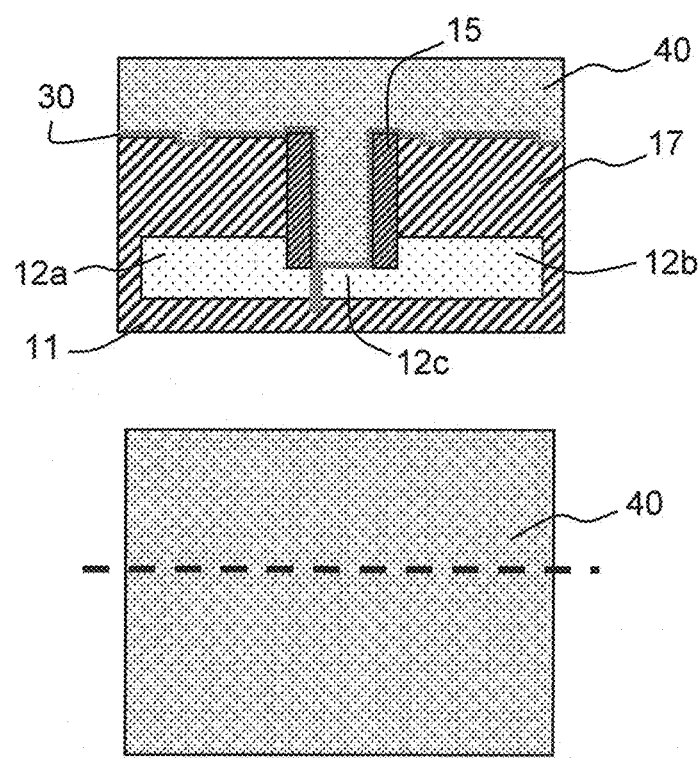
Figure 6I:
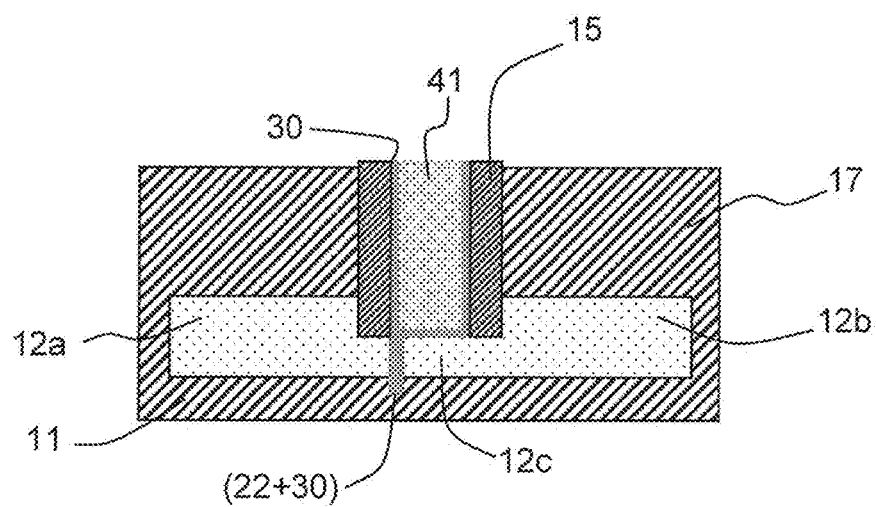
Figure 6I:
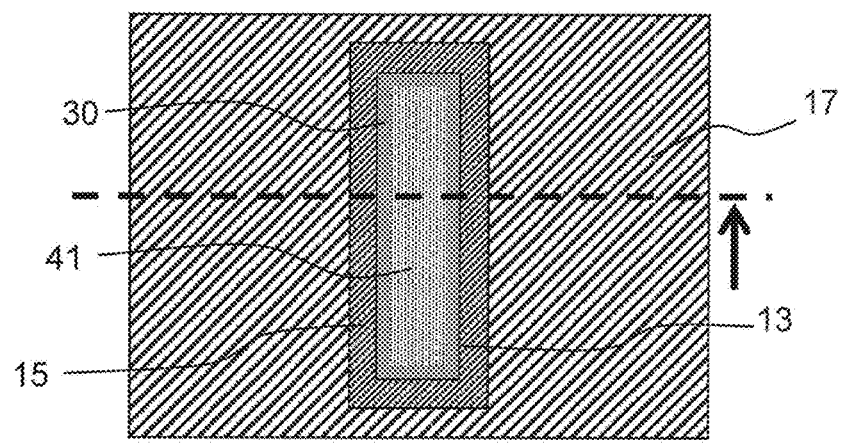

Step 9:

The rest of the sacrificial gate oxide at the bottom of the gate cavity is etched, as illustrated in FIG. 6i, leaving exposed the channel with its perforations 22.

A fourth series of steps allows the gate of the transistor having perforations in the channel to be produced:

Step 10:

An insulating layer, for example a layer of HfO₂, is deposited. It is advantageous to use an insulator having a high Young's modulus and for this insulator to fill the perforations produced in the channel because this configuration is favorable to the development of the shear strain. FIG. 6j illustrates the deposition of this insulating layer 30.

Step 11:

The cavity is filled by depositing at least one layer of at least one gate material 40 or of a plurality of materials possibly for example a metal compound such as TiN or TaN and polysilicon, as illustrated in FIG. 6k.

Step 12:

The gate materials exterior to the gate are removed by chemical mechanical polishing (CMP), in order to leave only the gate 41 of the transistor thus obtained integrating the perforations filled with the material 30 level with the channel edges, as illustrated in FIG. 6l.

The process described above is particularly advantageous for devices produced on a semiconductor film in which the source/channel/drain functions are defined with a thickness t ranging from 3 to about 70 nm. The geometric properties of the array of perforations are entirely determined by the nature of the block copolymer. This copolymer and the process used to etch the PMMA phase are chosen/optimized to obtain cylinders of diameter possibly ranging from about three nanometers to about fifteen nanometers.

It is advantageous to produce perforations, typically of cylindrical shape, of the smallest possible diameter so as to minimize the loss of material in the channel, while guaranteeing that the channel is etched right through its thickness.

Figure 7:
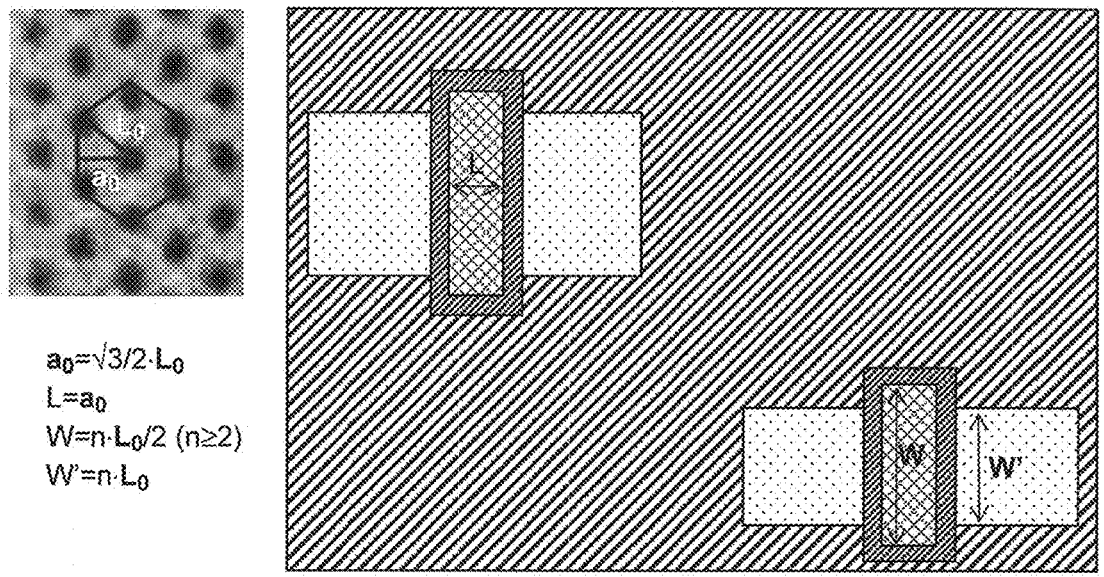
FIG. 7 illustrates an exemplary device of the invention comprising a plurality of transistors produced on the wafer scale in the case of deposition of a block copolymer of smaller thickness than the depth of the gate cavity left after removal of the sacrificial gate.

FIG. 7 shows a top view of two transistors according to the invention positioned on one and the same substrate, and also shows active zones with gates of dimension W, referred to as the gate width, along the y-axis, and of dimensions W, referred to as the active zone width.

According to the present invention, the spatial periodicity of the array of cylinders and therefore of perforations must be matched to the dimensions of the gate cavities, as described in the article by R. Tiron et al. J. Vac. Sci. technol. B 29(6), November/December 2011 "Optimization of block copolymer self-assembly through graphoepitaxy. A deflectivity study". More precisely, it is sought to match the distances between gate cavity edges to the periodicity of the array of cylinders, as illustrated in FIG. 7 which also shows the parameter $a_0=\sqrt{3}/2\, L_0$, where $L_0$ is the distance between two perforations, and L the channel size along the x-axis; it is sought that $L=a_0=\sqrt{3}/2\, L_0$ and $W=n\, L_0/2$ where $n \geq 2$.

If it is desired to guarantee an identical number of source- and drain-side perforations in the transistor thus produced, it is necessary for the width (dimension along the y-axis) of the active zone W' to correspond to a multiple of intercylinder distances, i.e. for:

$$W'=nL_0$$

When it is sought to produce on the wafer scale a set of transistors on the surface of a given substrate, the deposited thickness of block copolymer may prove to be a constraint on the position of the transistors relative to one another, as will be explained below.

First Variant of Wafer-Scale Production of Transistors According to the Present Invention, Using a Common Block Copolymer Deposition:

A block copolymer layer having a thickness smaller than the cavity depth H (in practice, H is about 20 to 60 nm) is deposited. In this first embodiment, the cavities may advantageously be located independently relative to one another.

Second variant of wafer-scale production of transistors according to the present invention, using a common block copolymer deposition:

The block copolymer is deposited with a thickness larger than the cavity depth H, corresponding to a step similar to that illustrated in FIG. 6d.

Figure 8:
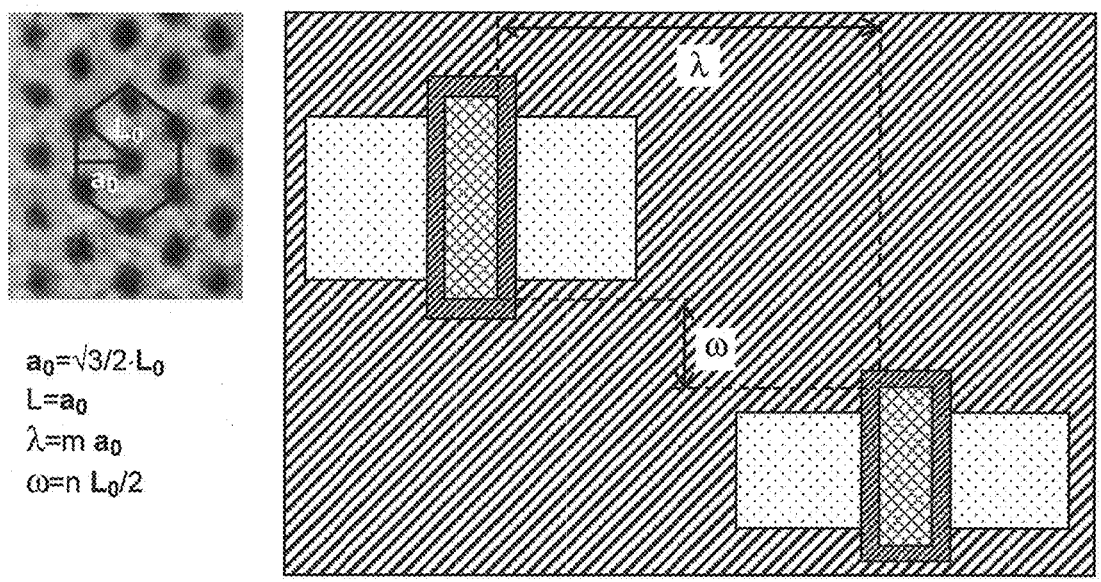
FIG. 8 illustrates an exemplary device of the invention comprising a plurality of transistors produced on the wafer scale in the case of deposition of a block copolymer of larger thickness than the depth of the gate cavity left after removal of the sacrificial gate.

This embodiment is advantageous for the production of a defectless array of copolymer (the distance between two neighboring perforations remaining rigorously equal to $L_0$) (in the sense of the term used in the publication by R. Tiron et al. J. Vac. Sci. technol. B 29(6), November/December 2011 "Optimization of block copolymer self-assembly through graphoepitaxy. A defectivity study") but it requires that the cavities be located in well determined positions relative to one another, both in the direction of the channel length L (distance λ) along the x-axis and in the direction of the gate width W (distance ω) along the y-axis, as illustrated in FIG. 8. This requires the following conditions to be met:

the distance λ between two adjacent gates along the x-axis must respect the following equation: $\lambda = m \cdot a_0$ where m is an integer; and the distance ω between two adjacent gates along the y-axis must respect the following equation: $\omega = n \cdot L_0/2$ where n is an integer.

FIG. 8 illustrates these two distances A and w between two adjacent transistors.

Exemplary Embodiment of a Device Comprising a Set of Transistors According to the Invention The block copolymer layer used to produce the perforations may advantageously be made of PS-b-PMMA containing 70 vol % styrene.

A neutralizing layer, which for PS-b-PMMA may be what is called a statistical polymer, PS-r-PMMA, is deposited, which must be thick enough to cover the bottom and flanks of the gate cavity (typically prepared by spreading a 3 wt % solution spread at 1500 rpm for cavities of depth of about 60 nm). The step of spreading the statistical polymer layer is followed by a step of annealing and rinsing.

The distance $L_0$ between cylinders (about 36 nm) corresponds to an optimal channel length L: $a_0$ of 31 nm [it will be recalled that this is obtained for a particular polymer and that it is possible by changing polymer (its molar mass) to access variable pitches (typically varying between 20 and 60 nm with PS-b-PMMA)].

In the same way, in order to obtain correctly positioned and repeatable perforation patterns, it is advantageous to make use of gate cavities of optimal width W equal to a multiple higher than 2× of 18 nm (half-distance between cylinders). Identical numbers of source- and drain-side perforations are guaranteed if optimal active zone widths W' are used i.e. widths that are multiples of 36 nm.

In the case where the cavities are filled with a copolymer thickness larger than the cavity depth, the optimal spacing between cavities is a multiple of 31 nm in the direction of L (distance λ) and a multiple of 18 nm in the direction of W (distance ω).

Third Variant of Wafer-Scale Production of Transistors According to the Invention, Using a Common Block Copolymer Deposition, Only Certain of Which Have Perforations in Their Channel.

Specifically, within a given integrated circuit, it is possible to select the devices in which it is desired to produce perforations.

By masking the gates where it is desired not to produce perforations, the sacrificial gate is not removed and the channel is not exposed to the etching.

Fourth Variant of Wafer-Scale Production of Transistors According to the Present Invention, in Which Variant the Transistors Have Different Channel Lengths.

Perforations may be produced in devices having different channel lengths L, along the x-axis, by repeating the perforation sequence with copolymers that are different (distance $a_0$) from the copolymer that sets the gate length able to receive the perforations.

The present invention was described above in the context of the production of perforations on both edges of the channel, it may also be advantageous to produce perforations only on a single channel edge, as is described in the following variant embodiment.

Variant Embodiment of a Transistor According to the Present Invention, in Which the Channel of the Transistor Comprises Perforations on a Single Edge It is possible to produce perforations on a single (source or drain) edge of the gate cavity by considering channel lengths $L \leq a_0$, where $a_0 = \sqrt{3}/2\, L_0$, $L_0$ being the distance between two perforations.

In this case, it is necessary to set up the fabrication process in order to set the (source or drain) side of the cavity level with which it is desired to position the PMMA cylinders.

Figure 9A:
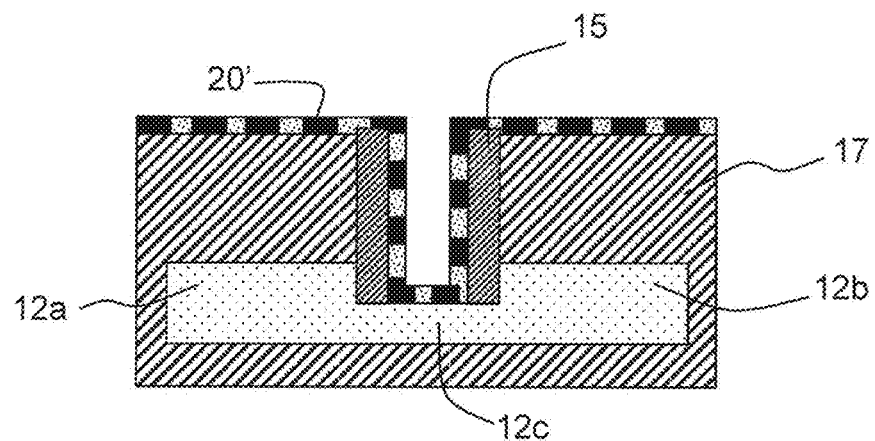
FIGS. 9a to 9c illustrate steps regarding the prior deposition of a neutralizing layer and the deposition of a block copolymer layer, these steps being included in an exemplary process for fabricating a transistor according to the invention in the case of production of perforations on a single of the two edges of the channel.
Figure 9A:
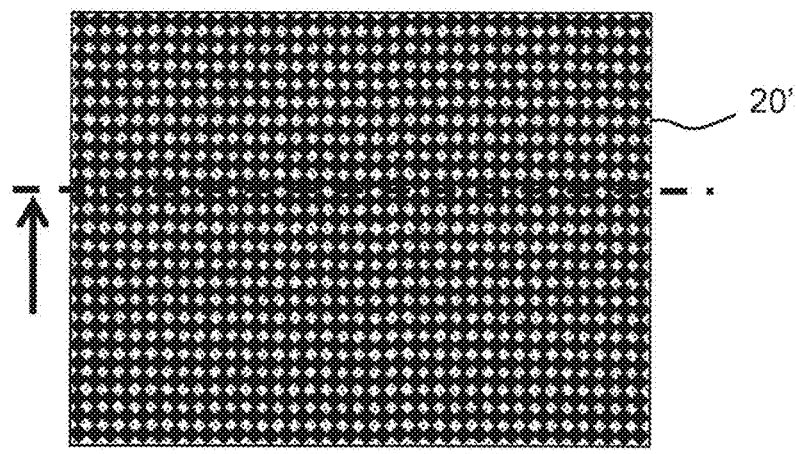

A neutralizing layer 20', possibly PS-r-PMMA, is deposited, as illustrated in FIG. 9a.

Figure 9B:
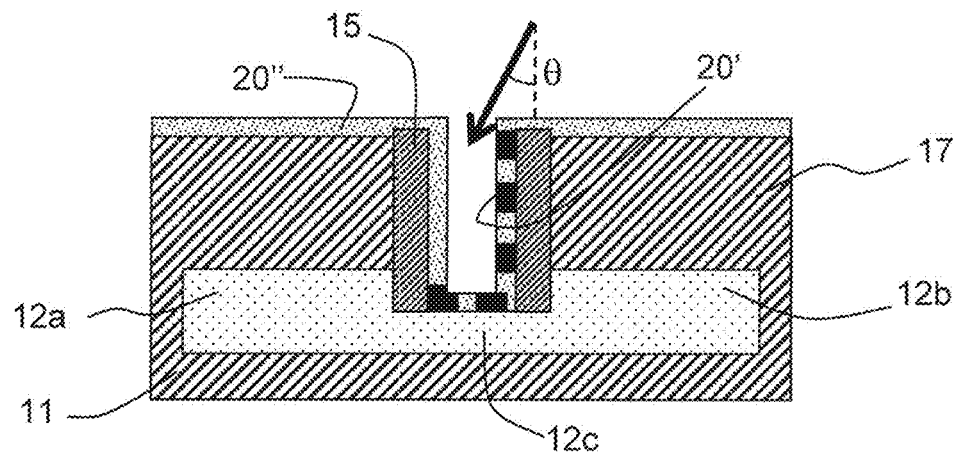
Figure 9B:
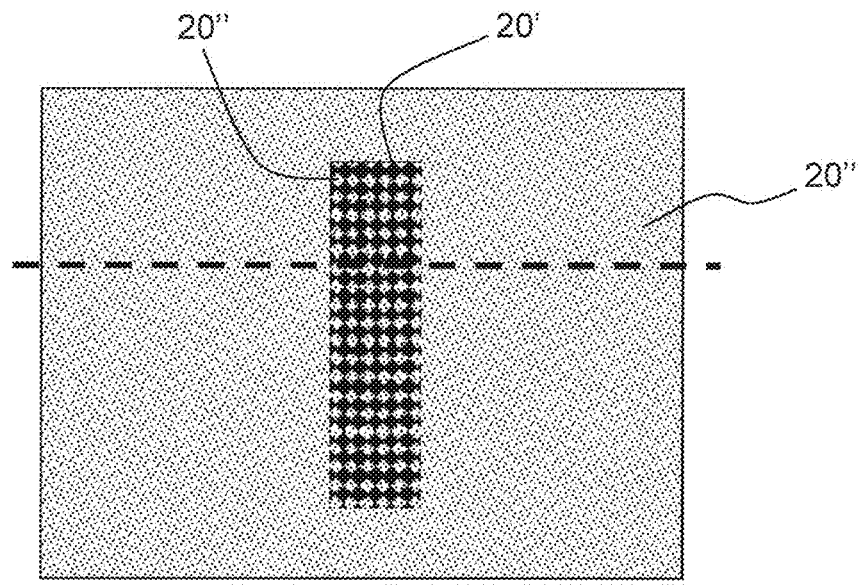

In a subsequent step, the PMMA component is made to disappear thereby generating a layer of material 20" on the side opposite to that on which it is desired to place the half cylinders (drain or source side, respectively). The treatment may be a hydrogen ion implantation (as described in patent application WO 2014/09662). This operation is carried out at a tilt angle (with a tilt angle θ relative to normal of: $\theta = \arctan(L/H)$) in order to affect only certain flanks, as illustrated in FIG. 9b.

Figure 9C:
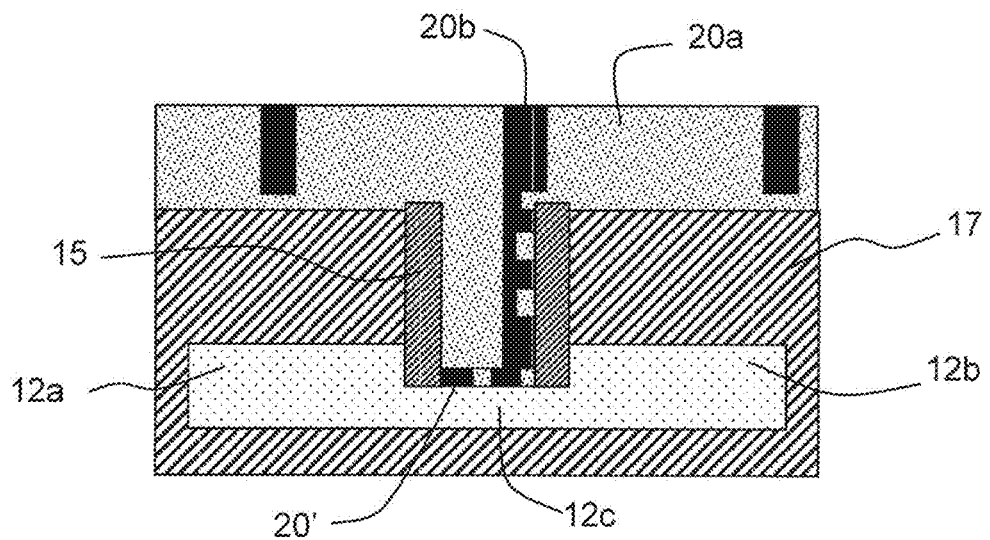
Figure 9C:
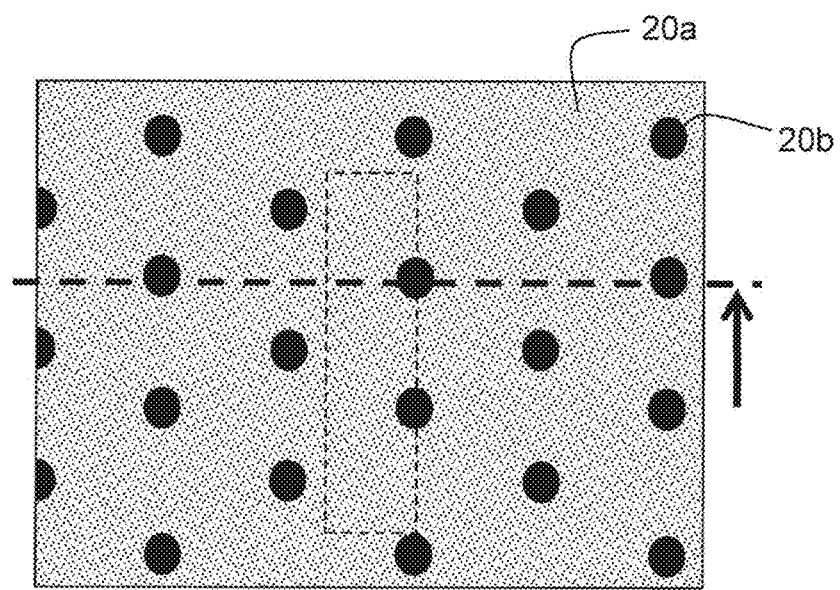

A layer of block copolymer comprising patterns 20b of PMMA in polystyrene 20a is then deposited, as illustrated in FIG. 9c which also shows the positions of the perforations relative to the dimensions of the gate cavity as shown by the dotted line.

The commensurability rules governing W and W' and relative to the perforation edges for the dimensions λ and ω apply in the same way as those described above.

Under these conditions a less substantial strain is obtained but the same block copolymer allows a range of devices of different channel lengths (all verifying $L \leq a_0$) to be perforated.

The invention claimed is:

1. A field-effect transistor, comprising:
an active zone, wherein the active zone comprises a source, a channel, a drain and a control gate, allowing a current to flow through said channel between said source and said drain along an x-axis, said channel comprising:
a first edge of separation with said source; and
a second edge of separation with said drain;
said channel being compressively or tensilely strained, wherein at least one of said first edge and said second edge comprises a localized perforation or a set of localized perforations so as to also create at least one shear strain in said channel,
and said channel does not comprise any localized perforation which is not directly and only on at least one of said first or said second edge,
wherein said channel is made of silicon, or of germanium or of an SiGe alloy.

2. The field-effect transistor according to claim 1, comprising a semiconductor layer on a surface of a buried oxide layer (BOX), said semiconductor layer being compressively or tensilely prestrained at the surface of said buried oxide layer.

3. The field-effect transistor according to claim 2, wherein the source and the drain comprise species able to be alloys of elements in order to place the channel under tension, compression, or a combination thereof.

4. The field-effect transistor according to claim 1, wherein the active zone is embedded in a dielectric zone comprising an upper portion, the control gate being located in a gate cavity defined in said upper portion of said dielectric zone.

5. The field-effect transistor according to claim 1, comprising the set of localized perforations staggered along any of said first edge and said second edge.

6. The field-effect transistor according to claim 1, comprising the set of localized perforations distributed over a single source-side or a drain-side channel edge.

7. The field-effect transistor according to claim 1, wherein the localized perforation or one of the set of localized perforations is filled with at least one filling material having a high Young's modulus, higher than or equal to 200 GPa.

8. The field-effect transistor according to claim 7, wherein the at least one filling material covers internal walls of a gate cavity.

9. The field-effect transistor according to claim 1, wherein dimensions of any of the localized perforation or the set of localized perforations are in a range of from three to fifteen nanometers, a thickness of said channel being in a range of from three to one hundred nanometers.

10. The field-effect transistor according to claim 1, wherein the active zone having a width W' along a y-axis perpendicular to the x-axis, wherein the width W satisfies an equation: $W'=n\ L_0$ where n is an integer and $L_0$ is a distance between two adjacent perforations of the set of localized perforations, a number of perforations of the set of localized perforations along the first edge being identical to a number of perforations of the set of localized perforations along the second edge along the y-axis.

11. A device comprising on a surface of a substrate a set of field-effect transistors according to claim 10.

12. The device according to claim 11, wherein distances between gate cavities of the field-effect transistors meet following criteria:
along the x-axis and along which a channel length L is defined, a distance $\lambda$ between two adjacent gates is equal to $m \cdot a_0$, where m is an integer and $a_0 = \sqrt{3}/2\ L_0$ ($\lambda = a_0$), being a distance between two rows of adjacent perforations of the set of localized perforations;
along the y-axis and along which the width W' of the active zone is defined, a distance $\omega$ between the two adjacent control gates is equal to $n \cdot L_0/2$ ($\omega = n \cdot L_0/2$).

13. A field-effect transistor, comprising:
an active zone, wherein the active zone comprises a source, a channel, a drain and a control gate, the active zone allowing a current to flow through said channel between said source and said drain along an x-axis, said channel comprising:
a first edge of separation with said source; and
a second edge of separation with said drain;
said channel being compressively or tensilely strained,
wherein at least one of said first edge and said second edge comprises a localized perforation or a set of localized perforations so as to also create at least one shear strain in said channel,
and said channel does not comprise any localized perforation which is not directly and only on at least one of said first or said second edge,
wherein the localized perforations are formed through a thickness of the said channel and through at least partly a thickness of a buried oxide layer located under the said channel.

* * * * *